United States Patent

[15] 3,652,948

[45] Mar. 28, 1972

Fierstien et al.

[54] POWER AMPLIFIER INCLUDING PLURALITY OF PUSH-PULL AMPLIFIER SECTIONS COUPLED BY FERRITE MATCHING TRANSFORMERS

[72] Inventors: Gary N. Fierstien, Skokie; Paul A. Talvensaari, Addison, both of Ill.

[73] Assignee: Motorola, Inc., Franklin Park, Ill.

[22] Filed: Feb. 24, 1970

[21] Appl. No.: 13,466

[52] U.S. Cl. ................................330/15, 330/118, 330/122
[51] Int. Cl. ..........................................................H03f 3/26
[58] Field of Search......................330/15, 30, 118, 122, 165, 330/166, 171, 188, 190, 195, 197; 325/127, 171, 172; 336/147, 233

[56] References Cited

UNITED STATES PATENTS

| | | | |
|---|---|---|---|
| 3,471,796 | 10/1969 | Wright | 330/31 X |
| 3,256,490 | 6/1966 | Gohm | 330/15 |
| 2,452,529 | 10/1948 | Snoek | 336/233 X |
| 3,102,984 | 9/1963 | Locanthi | 313/15 X |

OTHER PUBLICATIONS

J. W. Flowers " Parellel–Output Push–Pull Circuit" Electronics pp. 152- 154 April 1952.

*Primary Examiner*—Roy Lake
*Assistant Examiner*—Lawrence J. Dahl
*Attorney*—Mueller & Aichele

[57] ABSTRACT

A high power semiconductor amplifier, which may be used as the power amplifier of a radio transmitter, includes a plurality of push-pull amplifier sections cooperating to provide the required output power. The amplifier sections are coupled by broadband transformers having ferrite cores and a plurality of inter-wound coils. This provides direct current isolation of the sections and a high degree of coupling as required for broadband operation, and also results in stable operation and signals in the two amplifier sections which are in close phase relationship so that the outputs thereof can be combined in-phase for maximum efficiency. The coupling circuit at the input and/or the output of the sections includes windings of the transformers in series with a variable reactance element for tuning the same. The amplifier is usable over a wide range of frequencies with a minimum of adjustment.

12 Claims, 2 Drawing Figures

INVENTORS
GARY N. FIERSTIEN
PAUL A. TALVENSAARI
BY
Mueller, Aichele & Rauner
ATTYS.

INVENTORS
GARY N. FIERSTIEN
PAUL A. TALVENSAARI
BY Mueller, Aichele & Rauner
ATTYS.

POWER AMPLIFIER INCLUDING PLURALITY OF PUSH-PULL AMPLIFIER SECTIONS COUPLED BY FERRITE MATCHING TRANSFORMERS

BACKGROUND OF THE INVENTION

Electronic equipment, such as radio transmitters, have used semiconductor device, such as transistors, as amplifiers with a resulting saving in size and power consumption, and with improved reliability. There has been a problem, however, in the use of a plurality of transistor amplifier stages in multiple to provide high power output. It has been proposed to use a plurality of transistors in parallel, but in this case there is a problem that the impedances are very low, and to provide the required impedance matching the coupling circuits must have relatively high Q and are not broadband. Further, because of the variations in characteristics of individual transistors, circuits utilizing a plurality of transistors in parallel require additional circuit elements for balancing, and adjustable tuning controls are required which increase the complexity and cost of such circuits.

It has been proposed to use a plurality of separate transistor amplifiers and couple the outputs to provide increased power. It is difficult, however, to maintain the phase of the signals in the amplifiers the same so that when the output signals are combined, these signals are combined, these signals are added in-phase to provide the maximum output.

In a power amplifier for use in a radio transmitter, it is desired to provide a signal amplifier construction which can be used at different frequencies in a relatively wide frequency range. For example, for radio transmitters which operate in the 25 to 50 megahertz range, it is desired to cover this range with no more than four different amplifier constructions, and that a minimum of tuning adjustments are required to provide any frequency within the range of each amplifier. Similarly for operation in the 150 to 174 megahertz range, it is desired to cover the range with amplifiers of only two different constructions.

Because of the above and other problems it has not been possible to provide stable high gain amplifiers using transistors which provide the desired bandwidth and stability. Further, circuits which have been provided for such applications have been complex and expensive.

SUMMARY OF THE INVENTION

It is an object of the present invention to provide an improved power amplifier including a plurality of semiconductor devices and which includes broadband coupling circuits so that the amplifier can be used over a wide range of frequencies.

A further object of the invention is to provide a high power, broadband amplifier including a plurality of transistor amplifier sections, and a simple series coupling circuit for connection to the sections so that the currents in the sections can be combined in-phase for maximum output.

Another object of the invention is to provide an improved coupling circuit for a plurality of amplifier stages to couple the same to a driving source or to a load, and which provides direct current isolation between the amplifier sections so that they may be balanced or unbalanced with respect to an electrical reference.

A still further object of the invention is to provide a simple and inexpensive coupling circuit for a pair of push-pull transistor amplifier sections including a close coupled ferrite transformer for each section and a single tuning element for the two transformers.

In accordance with the invention, a high power semiconductor amplifier is provided which is suitable for use as a power amplifier in a radio transmitter. The amplifier will be described as used in a radio transmitter for operation in the 25 to 50 megahertz range, and in a radio transmitter for operation in the 150 to 174 megahertz range. The power amplifier includes a plurality of broadband push-pull transistor amplifier sections. The sections are coupled to a drive circuit and an output circuit by transformers so that DC isolation is provided. The transformers have ferrite cores and close coupled windings to provide effective stable operation over wide bandwidths, and to control the phase of the signals in the two amplifier sections so that the outputs can be efficiently combined. At least one of the coupling circuits for the effectively sections is provided by a series circuit including windings of the transformers coupled to the two sections and a variable reactance for tuning the same. Only this variable reactance and a variable reactance in the driver stage of the amplifier must be adjusted to set the amplifier for operation at a frequency in a wide frequency band; six megahertz in the 25 to 50 megahertz range, and twelve megahertz in the 150 to 174 megahertz range. The series coupling circuit is included at the output of the amplifier sections and includes the secondary windings of the output transformers in the 25 to 50 megahertz amplifier, and is provided at the input and is connected in series with the primary windings of the coupling transformers in the 150 to 174 megahertz amplifier. By use of the close coupling of the circuit and by properly balancing the push-pull sections, the stability is increased and the signals in the two sections are held in close phase relationship so that they can be combined in-phase and the maximum power capacity of the transistors of both pull-push sections is effectively utilized to provide the amplifier output.

DETAILED DESCRIPTION

Figure 1:
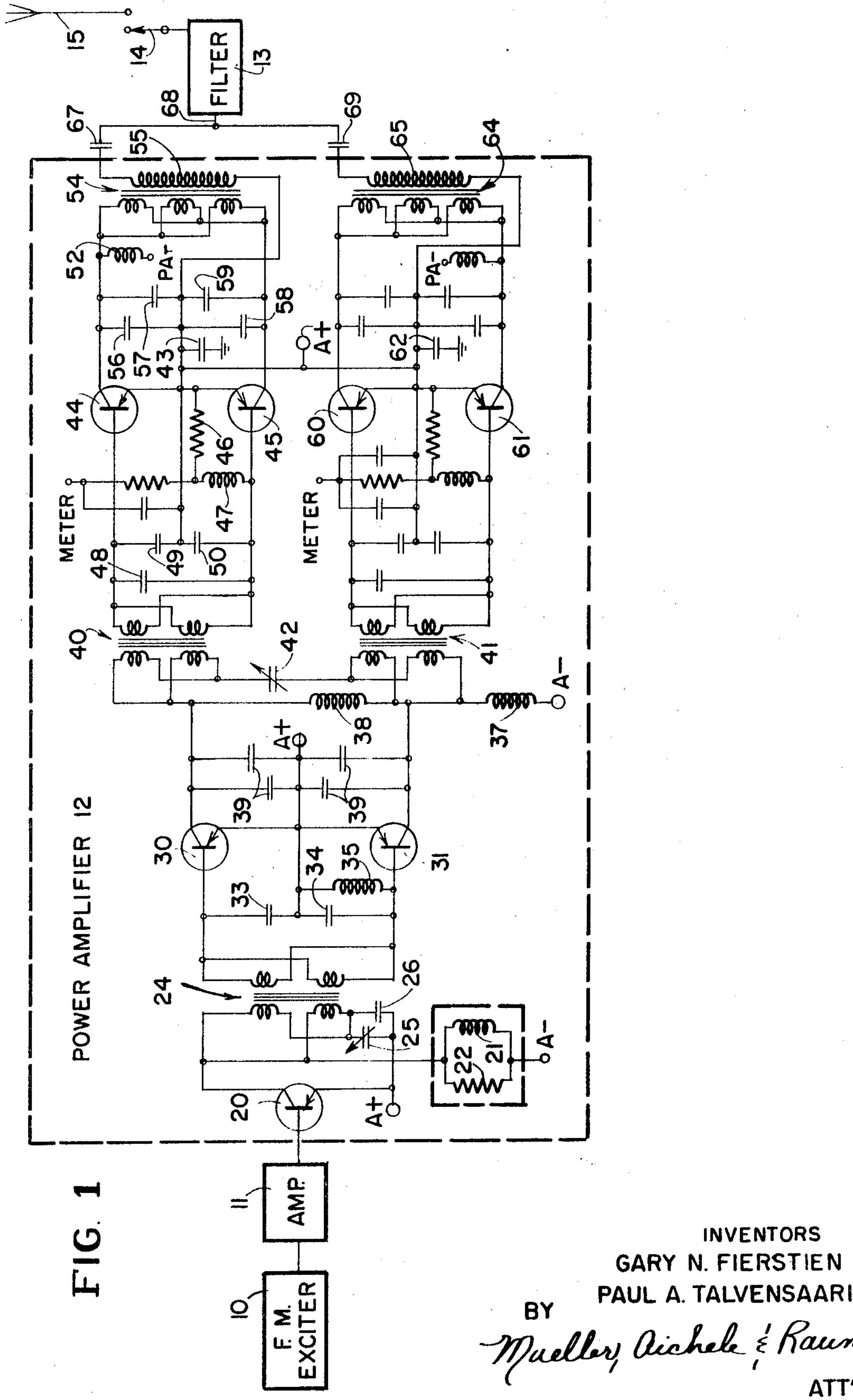
FIG. 1 is a schematic diagram of a radio transmitter for operating in a frequency range from 150 to 174 megahertz including the power amplifier of the invention.

The amplifier of the invention is illustrated in FIG. 1 in a FM radio transmitter. The transmitter includes an exciter 10 wherein a carrier wave is generated, and its frequency is modulated in accordance with audio or other modulating signals. The frequency modulated wave from exciter 10 is amplified in amplifier 11 which serves to isolate the exciter from the power amplifier, and which may be controlled to control the level of the signals applied to the power amplifier to prevent overloading the same. The output of the amplifier 11 is applied to power amplifier 12, the complete circuit diagram for which is shown and will be described. The output of the amplifier 12 is applied through harmonic filter 13 to antenna 15. A switch 14 is shown for connecting the filter 13 to the antenna 15, as may be used when the transmitter is connected to the same antenna as a receiver. The switch 14 is shown connecting the transmitter power amplifier to the antenna 15, but may be operated to the dotted position for connecting the antenna 15 to a receiver. Other components may be provided between the power amplifier and the antenna in certain applications, such as an antenna matching network, and a power sensing circuit.

Considering now the specific circuit of the power amplifier 12, the signal from amplifier 11 is applied to the base electrode of PNP transistor 20 which forms a pre-driver stage for the power amplifier. The emitter of the transistor 20 is connected to the A+ terminal which forms the reference potential for the amplifier. This terminal is heavily bypassed to the chassis ground, and is ground potential with respect to radio frequency (RF) signals. Negative potential is applied from A− terminal through parallel connected choke 21 and resistor 22 to the collector electrode of transistor 20. The output is derived between the collector and emitter electrodes by the circuit including transformer 24 and tuning capacitor 25. Fixed capacitor 26 is connected in parallel with capacitor 25. The transformer 24 includes a pair of parallel connected primary windings and a pair of parallel connected secondary windings on a ferrite core. To match the impedance of the transistors, the windings must have low impedance and this is facilitated by connecting the windings in parallel. To provide the required coupling, the windings are closely related on the ferrite core, being inter-wound on the core with each primary winding closely coupled to both secondary windings to provide maximum coupling therebetween for stable broadband operation. The transformers also isolate the unbalanced single ended pre-driver stage from the following balanced push-pull driver amplifier stage.

The driver stage of the power amplifier 12 includes PNP transistor 30 and 31 connected in a push-pull circuit. The emitters of transistors 30 and 31 are connected to the A+ terminal, which is previously stated represents ground potential with respect to RF signals. The secondary windings of transformer 24 are connected to the base electrodes of transistors 30 and 31 to provide signals thereto in opposite phases. Capacitors 33 and 34 stabilize the circuit and balance the input to the two transistors, and also affect the impedance match to the base electrodes. Bias potential is applied from the A+ terminal through DC feed choke 35 to the base electrode of transistor 31, and through the secondary windings of transformer 24 to the base electrode of transistor 30. A− potential is applied through chokes 37 to the collector of transistor 31, and through chokes 37 and 38 to the collector electrode of transistor 30.

The output circuit of the driver amplifier is connected between the collector electrodes of transistors 30 and 31. This circuit includes the primary windings of transformers 40 and 41 connected in series with variable capacitor 42. The transformers 40 and 41 may be of the same construction as transformer 24, with a ferrite core and parallel connected inter-wound primary and secondary windings. Capacitors 39 connected between the collectors of transistors 30 and 31 and the A+ terminal increase the gain stability and balance the sides of the push-pull circuit. These capacitors also cooperate with the lead inductances, which are significant at the impedance levels and frequencies involved, to form matching sections between the transistors 30 and 31 and the transformers 40 and 41.

The final power amplifier is formed by two push-pull transistor amplifier sections. The secondary windings of transformer 40 supply drive signals to the base electrodes of transistors 44 and 45, which are coupled to form a first push-pull transistor power amplifier section. The emitter electrodes of the PNP transistors 44 and 45 are connected to the A+ potential in the same manner described with respect to transistors 30 and 31. A further filter condenser 43 is connected from the A+ line to ground. Bias potential is applied from the A+ potential through resistor 46 and choke 47 to the base electrode of transistor 45, and through the secondary windings of transformer 40 to the base electrode of transistor 44. Fixed capacitor 48 is connected across the parallel connected secondary windings of transformer 40 for stabilizing and tuning the same, and fixed capacitors 49 and 50 are connected between the base electrodes and the emitter electrodes of transistors 44 and 45 for stability and balance. Meter connections to the amplifier sections are shown, but these are not described as they do not affect the circuit operation.

The output of the first push-pull amplifier section is derived between the collector electrodes of transistors 44 and 45 by transformer 54. This transformer has three parallel connected primary windings each connected between the two collector electrodes. Operating potential is applied to the collector electrode of transistor 44 from terminal PA- through choke 52. The potential applied at terminal PA- has additional filtering with respect to the potential applied at terminal A−. The collector potential for transistor 45 is applied from terminal PA− through choke 52 and the primary windings of transformer 54. Capacitors 56, 57, 58 and 59 are all fixed capacitors which increase stability, and provide balancing and impedance matching functions, as previously described.

The second push-pull amplifier section of the power amplifier 12 is formed by the circuit including transistors 60 and 61. The base electrodes of these transistors are connected to the secondary windings of transformer 41. The circuit of this second section may be identical to the circuit of the first push-pull section, which has been described, and this description will not be repeated. The output of the second push-pull section is applied to transformer 64 which has three parallel connected primary windings as described for transformer 54. The transformers 54 and 64 are very broadband, each having a ferrite core on which the windings are wound, with each primary winding being closely coupled to a portion of the secondary winding of the transformer.

The outputs of the two push-pull power amplifier sections is obtained by connecting the secondary windings 55 and 65, of transformers 54 and 64 respectively, in parallel to a 50 ohm line 68. Winding 55 is connected in the series circuit from ground including capacitors 43 and 67 to output line 68, and winding 65 is connected in the series circuit from ground including capacitors 62 and 69 to output line 68. Because of the close coupling and low leakage inductance afforded by the transformers 24, 40 and 41, and by the balanced and stable operation of the push-pull amplifiers, wide band operation is enhanced. The signals in the windings 55 and 65 are very accurately in-phase so that these signals add in-phase to provide maximum output to line 68. This output is applied through filter 13 to the antenna 15 of the transmitter, as previously described.

The amplifier of FIG. 1 is for use in the 150 to 174 megahertz frequency range. The transformers 24, 40 and 41 provide broadband operation, and have impedances of the order of 4 to 6 ohms to properly match the transistor stages for efficient operation. The transformers 54 and 64 are also very broadband and have input impedances of about 6 ohms and output impedances of about 100 ohms, so that the windings 55 and 65 in parallel present an impedance of about 50 ohms to match the line at terminal 68. The only elements which are adjustable for aligning the amplifier are the variable capacitor 25 in the pre-driver, and capacitor 42 in the series coupling circuit. By adjustment of these two elements of the amplifier, stable operation is provided at any frequency in a frequency band 12 megahertz in the frequency range from 150 to 174 megahertz.

Figure 2:
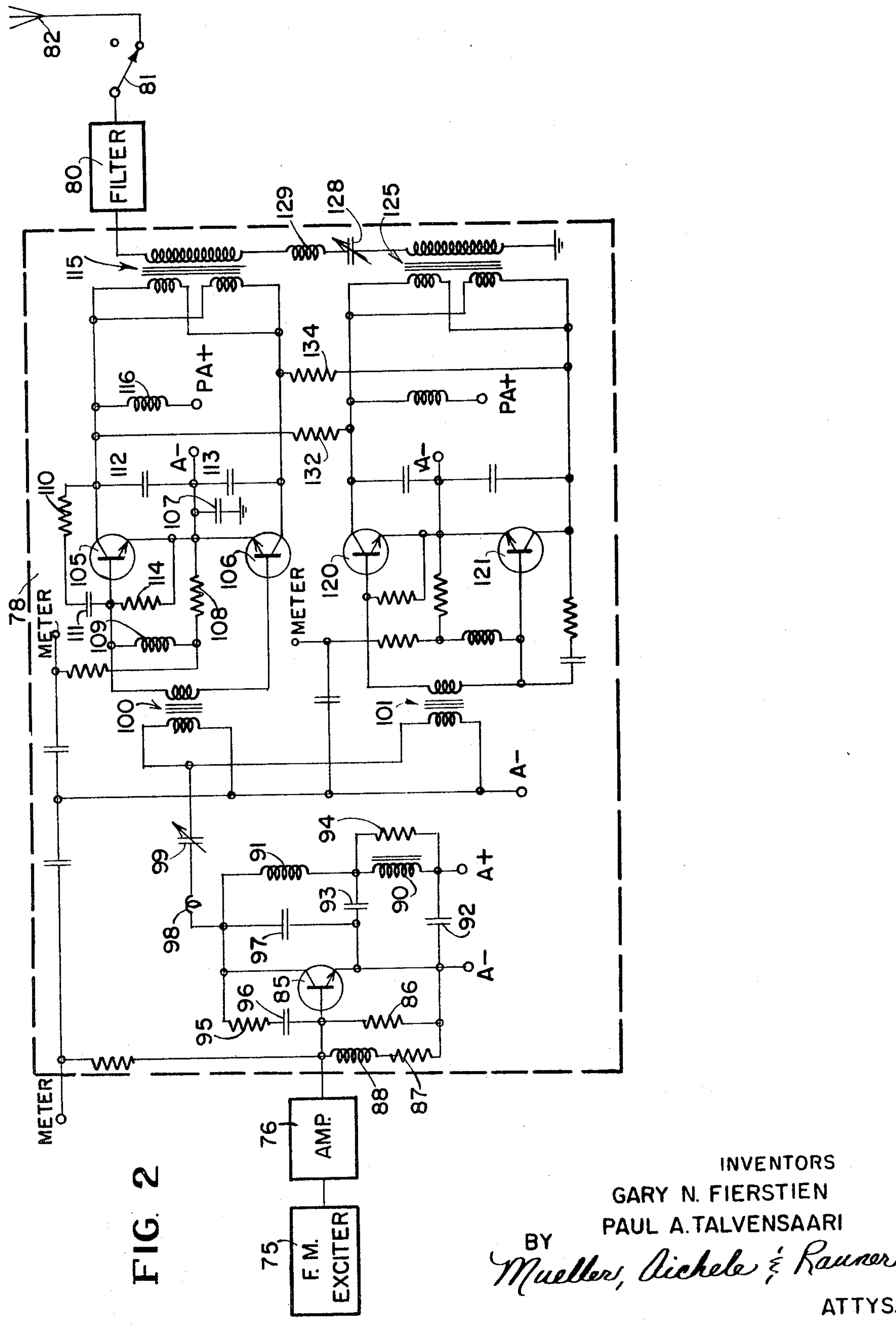
FIG. 2 is the schematic diagram of a radio transmitter operating in the 25 to 50 megahertz range including the power amplifier of the invention.

In FIG. 2 there is illustrated an FM transmitter for operating in the 25 to 50 megahertz range and utilizing a power amplifier forming a second embodiment of the invention. This transmitter includes exciter 75 which provides a frequency modulated wave which is amplified by amplifier 76. The signal from amplifier 76 is applied to the power amplifier 78 which is shown by circuit diagram and will be fully described. The output of the power amplifier 78 is applied through harmonic filter 80 to antenna 82. This may be coupled through a switch 81 for selectively connecting a receiver to the antenna 82, as previously described.

Considering the amplifier 78, this includes a driver stage having an NPN transistor 85. The signal from the amplifier 76 is applied to the base electrode of transistor 85, the emitter electrode of transistor 85 is connected to the A− potential terminal, and bias is applied from this terminal to the base electrode of transistor 85 through resistor 87 and coil 88. Resistor 86 is provided to reduce regeneration in the transistor 85 and improve the stability of the driver amplifier. Operating power is applied from the A+ terminal through chokes 90 and 91 to the collector electrode of transistor 85. Capacitors 92 and 93 cooperate with chokes 90 and 91 for decoupling the amplifier from the power supply, with capacitor 93 providing RF bypass and capacitor 92 being effective at lower frequencies. Damping resistor 94 is connected across choke 90 to reduce the Q thereof, resistor 95 and capacitor 96 provide negative feedback from the collector electrode of transistor 95 to the base electrode thereof, and capacitor 97 is connected between the collector and emitter electrodes, all to further improve the stability.

The output of the driver stage is coupled through the matching circuit including coil 98 and variable tuning capacitor 99 to transformers 100 and 101 which are connected in parallel. The coil 98 is not essential but may be used in an overload protection circuit. The output current is returned to A− by the connections from the primary windings of the transformers 100 to 101 to the A− terminal. Although metering connections for the amplifier are shown, these will not be described as they are not required for the circuit operation. Transformers 100 and 101 each feed a push-pull transistor amplifier section, which together provide the output of the power amplifier.

The secondary winding of transformer 100 is connected to the base electrodes of NPN transistors 105 and 106. The emitter electrodes of these transistors are connected to the A− terminal. Bias is applied to the base electrode of the transistor 105 through resistor 108 and choke 109, and to the base electrode of transistor 106 through the secondary winding of transformer 100. The A− terminal is heavily bypassed at the supply point and is further bypassed by capacitor 107. Stabilizing resistor 114 is connected between the base and emitter electrodes of transistor 105. The collector electrodes of transistors 105 and 106 are connected to A− by capacitors 112 and 113 which provide stability and tend to balance the push-pull circuit. The output of the first push-pull section is derived by transformer 115 which has parallel connected primary windings, each connected between the collector electrode of transistor 105 and the collector electrode of transistor 106. Operating potential from terminal PA+ is applied through choke 116 to the collector electrode of transistor 105 and through the primary windings of Transformer 115 to the collector electrode of transistor 106. This PA+ is filtered to a greater extend than the A+ potential applied to the driver stage, but has generally the same value. Feedback is provided from the collector electrode of transistor 105 to its base electrode through resistor 110 and capacitor 111 to increase stability.

Transformer 101 is connected to a second section of the output amplifier which includes transistors 120 and 121. The circuit connected to these two transistors is identical to that connected to transistors 105 and 106 and will not be described in detail. The output of the second section is applied to transformer 125 which has parallel connected primary windings as described for transformer 115. A stabilizing resistor is provided between the base and emitter electrodes of transistor 120, and a negative feedback circuit is connected from the collector electrode of transistor 121 to the base electrode thereof for increased stability.

The secondary windings of transformers 115 and 116 are connected in series with each other and in series with tuning capacitor 128 and coil 129 to the input of filter 80. The two sections of the amplifier are both isolated from the direct current supply by the input transformers 100 and 101, and the close coupling afforded by these transformers provides stable wide band operation. The stabilizing and balancing of the push-pull sections provides signals therein which are in-phase and can be combined to provide maximum output to the filter 80. Resistor 132 connected between the collector electrodes of transistors 105 and 120, and resistor 134 connected between the collector electrodes of transistors 106 121 hold these electrodes at substantially the same potential to insure that the signals in the two amplifier sections have the same phase.

The transmitter of FIG. 2 is designed to operate in the frequency range from 25 to 50 megahertz, and has a bandwidth for operation at any frequency in a 6 megahertz range by adjustment of only capacitor 99 of the coupling circuit from the driver stage, and capacitor 128 in the series coupling circuit at the output.

Ferrite cores for operation in this frequency range have higher Q and provide better coupling so that the transformers 100 and 101 can provide the desired coupling and bandwidth with single primary and secondary windings, rather than parallel inter-wound windings as used in transformers 24, 40 and 41 in the amplifier of FIG. 1. The output impedance of each amplifier section is of the order of 6 ohms. The series circuit including the secondary windings of transformers 115 and 125 is connected to a 50-ohm line, so that the output impedance of the secondary windings of each of the transformers 115 and 125 should be 25 ohms, and the two windings in series will provide the 50 ohm impedance required to match the line. This requires an impedance step-up from 6 ohms to 25 ohms, or only about 1:4, by the transformers 115 and 125.

The amplifier circuits which are described above have been constructed and have been found to operate in a highly satisfactory manner. These amplifiers have been provided in radio transmitters and have had a sufficient bandwidth that transmitters manufactured to the same specifications can be operated at different frequencies in a relatively wide range. This results in a manufacturing cost which is much less than that for transmitters constructed to different specifications.

We claim:

1. A power amplifier circuit for operation at a frequency in the range above 25 megahertz including in combination, a plurality of amplifier sections each including a pair of transistors connected in push-pull and having an input circuit and an output circuit, a plurality of wide band transformers each having a ferrite core and first and second closely coupled winding means on said core, one of said input circuits and said output circuits of said amplifier sections including respectively said first winding means of said transformers, a first circuit including said second winding means of all of said transformers and variable reactance means for tuning the same, with said second winding means of all of said transformers and said variable reactance means being connected in series with each other, and a second circuit transformer coupled to the other of said input and output Circuits of all of said amplifier sections, said first and second circuits providing direct current isolation of said amplifier sections and holding the signals therein substantially in-phase.

2. A power amplifier circuit in accordance with claim 1 wherein each of said amplifier sections includes conductors connecting said transistors to said winding means of said transformers and capacitors connected to said conductors and cooperating with the inductance thereof to form impedance matching sections for efficient stable wide band operation.

3. A power amplifier circuit in accordance with claim 1 wherein the amplifier is adapted for operation throughout a wide frequency range, and said variable reactance means is the only element of the amplifier circuit which must be adjusted for operation at different frequencies in the wide frequency range.

4. A power amplifier circuit in accordance with claim 1 wherein said transformers each include an elongated rod core and a pair of primary windings connected in parallel and a pair of secondary windings connected in parallel on said elongate ferrite core, with each of said primary windings being closely coupled to both of said secondary windings.

5. A power amplifier circuit in accordance with claim 1 wherein said transformers have primary and secondary windings, with said secondary windings connected in said input circuits of said amplifier sections, and said first circuit includes said primary windings of said transformers connected in series with a variable tuning capacitor.

6. A power amplifier circuit in accordance with claim 5 including first and second amplifier sections each having circuit means coupled to said transformers thereof providing stable wide band operation, and wherein each of said transformers includes an elongated ferrite core having a pair of parallel connected primary windings and a pair of parallel connected secondary windings thereon, with each of said primary windings being closely coupled to both of said secondary windings.

7. A power amplifier circuit in accordance with claim 5 further including a driver amplifier coupled to said first circuit for applying signals thereto.

8. A power amplifier circuit in accordance with claim 7 wherein said driver amplifier is a push-pull transistor amplifier, and further including a single ended pre-driver transistor amplifier coupled to said driver amplifier by a coupling circuit including a further transformer having a ferrite core and closely coupled windings thereon, with said coupling circuit further including a variable tuning capacitor which together with the variable tuning capacitor connected in series with said primary windings constitute the only elements of the power amplifier circuit which must be adjusted for operation at different frequencies in a wide frequency range.

9. A power amplifier circuit in accordance with claim 1 wherein said transformers have primary windings and secondary windings, with said primary windings being connected in said output circuits of said amplifier sections, and said first circuit includes said secondary windings of said transformer connected in series with a variable tuning capacitor.

10. A power amplifier circuit in accordance with claim 9 including first and second amplifier sections each having circuit means coupled to said transformers thereof providing stable wide band operation, and wherein each of said transformers includes an elongated ferrite rod core having a pair of parallel connected primary windings and a secondary winding thereon, with each of said primary windings being closely coupled to a portion of said secondary winding.

11. A power amplifier circuit in accordance with claim 10 wherein said second circuit includes broadband ferrite core transformers coupled to said input circuits of all of said amplifier sections, and further including a driver amplifier coupled to said second circuit.

12. A power amplifier circuit in accordance with claim 11 including a coupling circuit connected between said driver amplifier and said second circuit having a variable capacitor, with said variable capacitor and said variable reactance means of said first circuit forming the only elements of said power amplifier circuit which must be adjusted for operation at different frequencies in a wide frequency range.

* * * * *